United States Patent
Grzelka et al.

(10) Patent No.: US 9,360,513 B2
(45) Date of Patent: Jun. 7, 2016

(54) METHOD AND SYSTEM FOR DETERMINING PARAMETERS OF A SATELLITE SIGNAL

(71) Applicant: ADVANCED DIGITAL BROADCAST S.A, Geneva (CH)

(72) Inventors: Piotr Grzelka, Zielona Gora (PL); Robert Gizycki, Zielona Gora (PL)

(73) Assignee: ADVANCED DIGITAL BROADCAST S.A., Geneva (CH)

( * ) Notice: Subject to any disclaimer, the term of this patent is extended or adjusted under 35 U.S.C. 154(b) by 167 days.

(21) Appl. No.: 14/333,560

(22) Filed: Jul. 17, 2014

(65) Prior Publication Data
US 2015/0028896 A1    Jan. 29, 2015

(30) Foreign Application Priority Data
Jul. 23, 2013   (EP) .................................... 13177527

(51) Int. Cl.
| | |
|---|---|
| *G01R 27/26* | (2006.01) |
| *G01R 29/08* | (2006.01) |
| *H01Q 1/12* | (2006.01) |
| *H04B 5/00* | (2006.01) |
| *H04H 20/12* | (2008.01) |
| *H04H 40/90* | (2008.01) |

(52) U.S. Cl.
CPC .......... *G01R 29/0892* (2013.01); *H01Q 1/1257* (2013.01); *H04B 5/0012* (2013.01); *H04B 5/0043* (2013.01); *H04H 20/12* (2013.01); *H04H 40/90* (2013.01)

(58) Field of Classification Search
CPC . G01R 29/0892; H01Q 1/1257; H04H 20/12; H04H 40/90; G01S 19/48; G05D 1/024; G05D 1/0278; G06K 9/00798; H04L 25/0272; H04L 25/029
USPC .................................................. 324/658–690
See application file for complete search history.

(56) References Cited

U.S. PATENT DOCUMENTS

| | | | |
|---|---|---|---|
| 6,597,731 B1 * | 7/2003 | Shuholm ............. | H04L 25/0292 375/220 |
| 6,937,188 B1 | 8/2005 | Saunders | |
| 7,016,643 B1 | 3/2006 | Kuether | |
| 2005/0122119 A1 * | 6/2005 | Barlow .................... | G01D 5/24 324/662 |

FOREIGN PATENT DOCUMENTS

EP         1580833  A1      9/2005

* cited by examiner

*Primary Examiner* — Vincent Q Nguyen
(74) *Attorney, Agent, or Firm* — Mark M. Friedman

(57) ABSTRACT

A method and system for determining parameters of a satellite signal present in a coaxial cable, the method including the steps of aligning two capacitive coupling sensors in proximity to a length of the coaxial cable, wherein the distance between the capacitive coupling sensors is below 10 centimeters; receiving from two capacitive coupling sensors a signal being a differential voltage in the coaxial cable between the locations of the capacitive coupling sensors wherein the voltage is relative to a voltage level in a coaxial cable; amplifying the differential voltage by a bandpass amplifier; detecting a valid DiSEqC command sequence being indicative of signal quality.

7 Claims, 4 Drawing Sheets

METHOD AND SYSTEM FOR DETERMINING PARAMETERS OF A SATELLITE SIGNAL

The present invention relates to determining parameters, such as quality, of a satellite signal.

One of most common measures of signal quality is the number of bit errors is the number of received bits of a data stream over a communication channel that have been altered due to noise, interference, distortion or bit synchronization errors (source: Wikipedia).

The bit error rate or bit error ratio (BER) is the number of bit errors divided by the total number of transferred bits during a studied time interval. BER is a unitless performance measure, often expressed as a percentage.

Other techniques of measuring signal quality are packet error rate or Signal-to-noise ratio (often abbreviated SNR or SN) or a combination of any of the aforementioned techniques.

The technical concept presented herein relates to a method that finds its application in satellite antenna installation.

Currently, almost all of receivers of satellite signal, such as set-top box (STB), are equipped with satellite signal level and quality indicators. Such indicators can be displayed on a display screen or on STB's front panel LED\LCD displays.

When an installer of a satellite signal reception system is to use the known indicator, it usually requires another person, who passes the information to installer on the roof about its exact reading value. It would be advantageous if the installer has a direct access to the reading information.

Prior art discloses satellite signal meters that assist with aligning a satellite-TV dish without having to take the receiver outside. Such satellite signal meters help in optimizing dish alignment. In order to use such satellite signal meter one must disconnect the coaxial cable running from the receiver to the LNB (typically at the LNB end) and then connect the satellite signal meter to the LNB using a short coaxial cable. The receiver may then also be connected to the signal meter. The signal meter may then also be connected between receiver and LNB.

Prior art publication U.S. Pat. No. 6,937,188 B1, entitled "Satellite antenna installation tool", discloses a portable device for assessing the degree of alignment between antenna and a satellite. In one embodiment, the device includes a portable housing that includes components for producing an audio and/or visual indication of the antenna's alignment with the satellite. The device may be self-contained and provide power to the antenna's frequency converter during the alignment process. The portable device is electronically coupled by a coaxial cable to a conventional RF input F-connector.

Drawback of this solution is that the measurement is executed on a different device than will ultimately use the signal. In practice there is a different tuner-demodulator arrangement.

Figure 2:
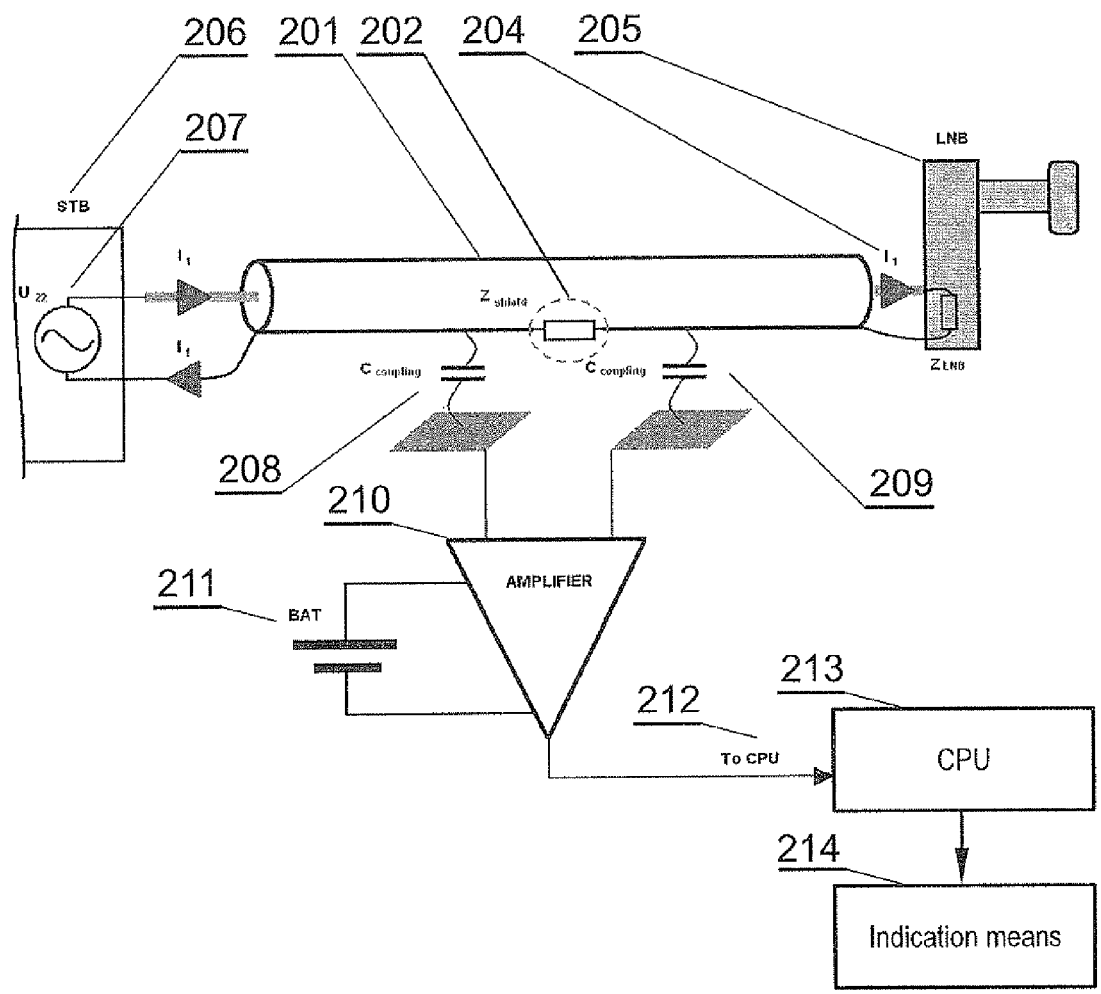

Another prior art publication US 20060181455 A1 entitled "Method and device for accurately pointing a satellite earth station antenna", discloses an antenna pointing indicator system 60 a may also include a housing 140 that encloses particular components of antenna pointing indicator system 60 a and/or to which particular components of antenna pointing indicator system 60 a are mounted and forms a single physical device that includes the relevant components. FIG. 2 shows two example configurations of housing 140 to illustrate that signal meter 180 may or may not be enclosed along with signal amplifier 170, filter selector 160, and filters 150 in a common housing 140. If signal meter 180 is not enclosed with the filter assembly 150, filter selector 160 and optional amplifier 170 in a common housing; signal meter 180 may couple to output port 172 using, for example, a coaxial cable to connect the two components. In such an embodiment, signal meter 180 may also be configured to provide power to signal amplifier 170 through the coaxial cable or other element coupling the two components. In general, however, antenna pointing indicator system 60 a may include a housing 140 shaped and/or configured to include any appropriate combination of the individual elements of antenna pointing indicator system 60 a. Alternatively, antenna pointing indicator system 60 a may not include a housing 140 of any type and the elements of antenna pointing indicator system 60 a may all represent physically separate components.

In operation, in the illustrated embodiment, antenna pointing indicator system 60 receives an input signal at input port 162. Antenna pointing indicator system 60 a may couple to user Earth station antenna 20 and this input signal may comprise the total composite signal received by user Earth station antenna 20 from satellite antennas 70, including background noise and interference. In a particular embodiment, input port 162 couples to user Earth station antenna 20 through a coaxial cable.

Similarly, drawback of this solution is that the measurement is executed on a different device than will ultimately use the signal. In practice there is a different tuner-demodulator arrangement.

It is therefore desirable to and improved method and system for determining parameters of a satellite signal in which the measurement is executed on the same that will ultimately use the signal. Additionally, such device should be cost effective and provide information about the parameters of a satellite signal in proximity to the satellite antenna.

The object of the present invention is a method for determining parameter of a satellite signal present in a coaxial cable, the method comprising the steps of aligning two capacitive coupling sensors in proximity to a length of the coaxial cable, wherein the distance between the capacitive coupling sensors is below 10 centimeters; receiving from two capacitive coupling sensors a signal being a differential voltage in the coaxial cable between the locations of the capacitive coupling sensors, wherein the voltage is relative to a voltage level in a coaxial cable; amplifying the differential voltage by a bandpass amplifier; detecting a valid DiSEqC command sequence being indicative of signal quality; outputting a signal being indicative of signal quality to an indication means.

Preferably, aligning the two capacitive coupling sensors in proximity to a length of the coaxial cable means aligning the two capacitive coupling sensors adjacent to the coaxial cable.

Preferably, the two capacitive coupling sensors are insulated.

Preferably, the valid DiSEqC command sequence being indicative of signal quality comprises a frame byte value of E0 (hexadecimal), address value of 40 (hexadecimal), command value of 44 (hexadecimal).

Preferably, the valid DiSEqC command sequence being indicative of signal quality comprises a data byte comprising information regarding signal quality/strength as determined by a receiver connected to the coaxial cable.

A further object of the present invention is a device for determining a parameter of a satellite signal present in a coaxial cable, the device comprising two capacitive coupling sensors in proximity to a length of the coaxial cable, wherein the distance between the capacitive coupling sensors is below 10 centimeters; an electrical path connecting each of the two capacitive coupling sensors to a bandpass amplifier; an output path of the bandpass amplifier connected to a processor comprising means for detecting a valid DiSEqC command sequence being indicative of signal quality; an output path configured to output a signal being indicative of signal quality to an indication means.

Preferably, a discrimination circuit is present between the bandpass amplifier and the processor configured to obtain a square signal from a sinusoidal signal.

Figure 1:
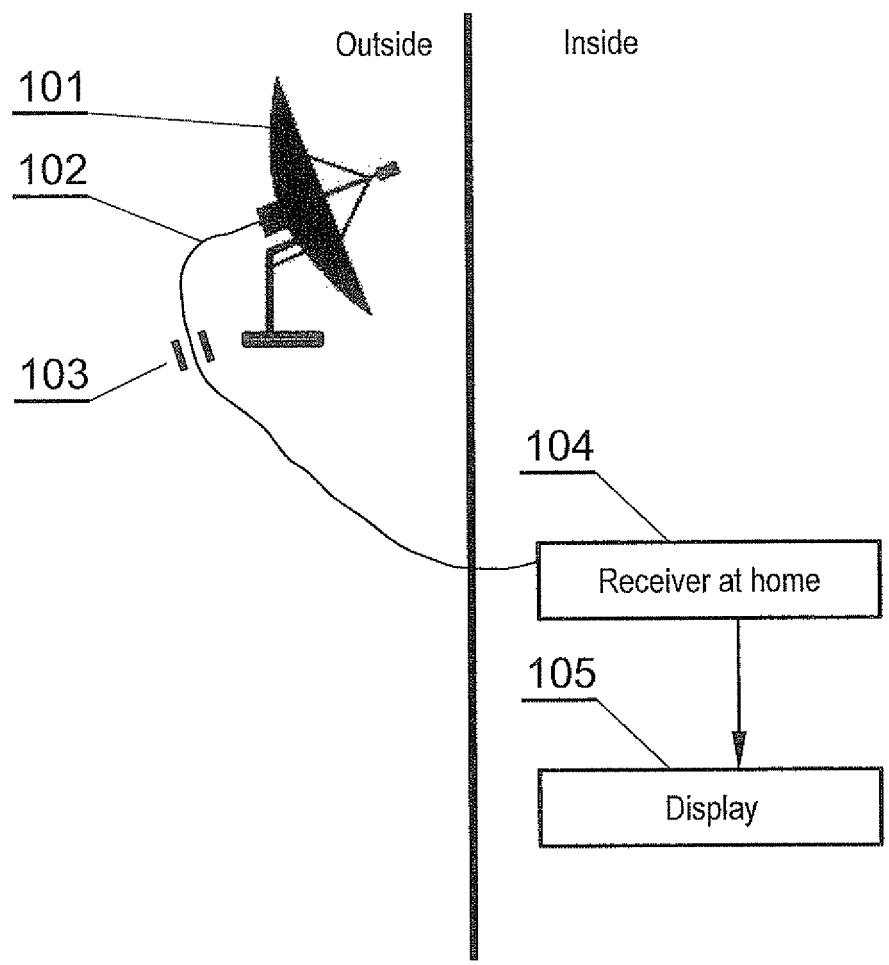
Figure 3:
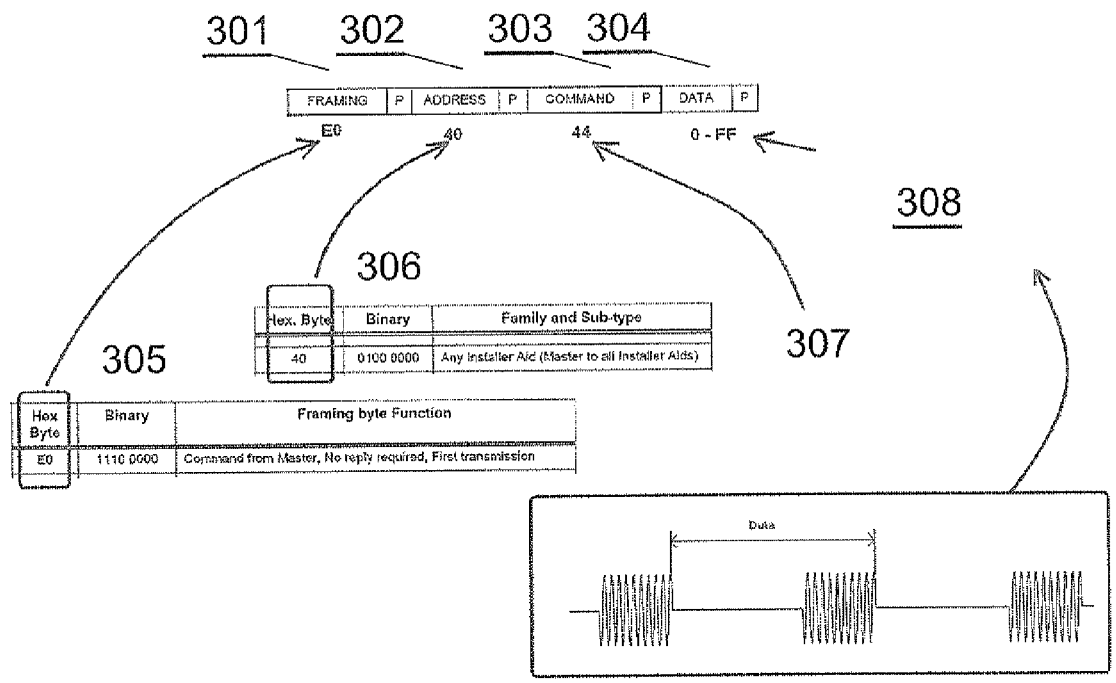

The present invention is shown by means of exemplary embodiments on a drawing, in which:

FIG. 1 presents a schematic diagram of a satellite antenna adjustment environment;

FIG. 2 presents a detailed schematic diagram of the calibration device according to the present invention;

FIG. 3 presents a generic DiSEqC command sequence; and

Figure 4:
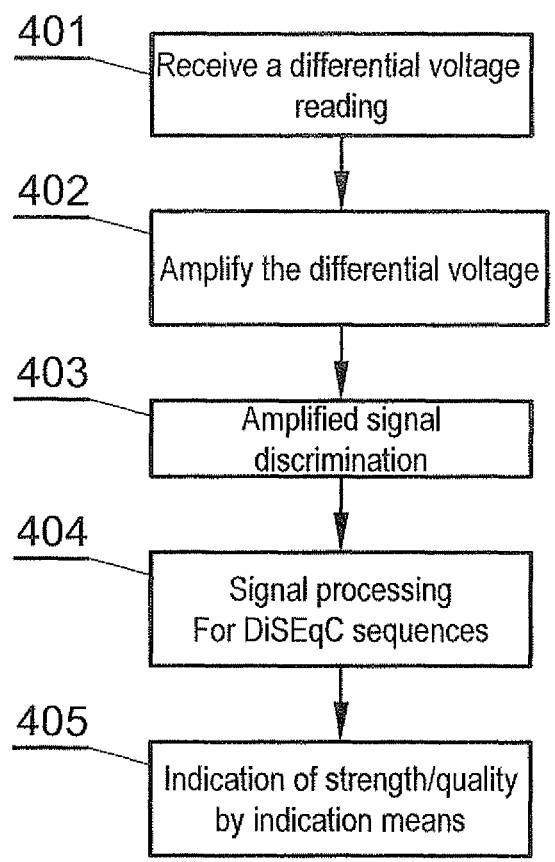

FIG. 4 shows a method for satellite antenna alignment using the device of FIG. 2.

FIG. 1 presents a schematic diagram of a satellite antenna adjustment environment. A satellite antenna 101 receives a signal from a satellite transmitter (not shown). The satellite antenna 101 comprises a low-noise block downconverter (LNB) which collects the radio waves from the satellite dish. The lower frequency IF output signal emerges from a socket on the LNB to which the coaxial cable 102 connects.

The coaxial cable 102 is typically passed to the inside of a household where it is connected to a satellite signal receiver 104, such as a set-top box, comprising a satellite tuner and demodulator. After processing the satellite signal, the satellite signal receiver 104 passes its output signal to a display 105 connected to it.

The object of the present invention is a calibration (or alternatively 'positioning') aiding device 103 that is positioned in proximity to the coaxial cable 102 near the LNB. Preferably, the device 103 is adjacent to the coaxial cable 102, but does no require a direct contact with any electrical elements of the coaxial cable 102. Otherwise proximity is understood to be in the range of preferably less than 5 millimeters. Hence, the installation of the calibration aiding device 103 does not require any physical changes in existing antenna—receiver setup i.e. coaxial cable 102 connection.

DiSEqC (Digital Satellite Equipment Control) is a special communication protocol for use between a satellite receiver and LNB. DiSEqC was developed by European satellite provider Eutelsat, now acting as the standard's agency for the protocol.

The DiSEqC protocol is used between the receiver 104 and the LNB of the satellite antenna 101. The transmission of DiSEqC communication is effected by means of the coaxial cable 102.

FIG. 2 presents a detailed schematic diagram of the calibration device. The invention is based on detection of an alternating current flowing through a coaxial cable 102, 201. The invention is implemented as a 22 kHz signal detector used in a satellite signal finder. 22 kHz is a frequency on which DiSEqC data is transmitted.

A coaxial cable and its shield are not ideal and it is possible to pass information about cable's current to another electronic circuit without destroying or cutting the coaxial cable or disconnecting an LNB from a receiver. The present invention uses capacitive coupling phenomenon.

When a current I1 flows, between the receiver 206 and the LNB 205, through the centre copper core, the same current flows through the woven copper shield. A voltage 207 is generated for LNB by an LNB power source installed in the receiver 206.

Because of fact that the shield has a specified impedance (Z shield 202), the current flowing through it, generates a voltage on the Z shield. This particular voltage can be passed through to the metal plates (sensors) of the capacitive coupling 208, 209 and next to an amplifier 210 powered with a battery 211. Preferably the sensors 208, 209 are insulated in order to avoid electrical connection between them, for example in different environmental conditions.

The spread of sensors is preferably below 10 cm because with the increase of the distance there will be introduced interferences that may need to be shielded. For the sake of cost effective solution the sensors are preferably within 10 cm spread, wherein both sensors are in proximity or adjacent to the coaxial cable 102.

The calibration aiding device 103 may be attachable to the coaxial cable 102 by means of some attaching/fastening means such as a snap, a clasp, a buckle or the like allowing for keeping the calibration aiding device 103 a chosen, stable location at the coaxial cable 102.

The efficiency of the coupling between the calibration device 103 and the coaxial cable 102 is a function of sensors metal plates' area, distance from the coaxial cable shield and amplifier's input impedance. The voltage generated on Z shield 202 depends on I1 current value.

The amplifier 210 is preferably a differential bandpass type. The center frequency of the bandbass filter should preferably be the same as detected voltage's frequency. The embodiment, where the center frequency of the bandbass filter is the same as detected voltage's frequency is especially advantageous.

The internal circuits of the device, such the amplifier 210 should be supplied from battery 211 and preferably hang on a cable to minimize parasitic capacitance to the ground. Its input impedance of the amplifier 210 should preferably be very high (FET type, in the range of Giga Ohm(s)) to guarantee good coupling efficiency.

The signal output by the amplifier 210 is input to a processing unit 212, which recognizes DiSEqC command sequences and may identify a command indicating signal quality/strength. When such command is identified a driving signal for indication means 213 is supplied. The indication means 213 may be a buzzer, or a loudspeaker or a light emitting diode or display (eg. LCD) or the like.

The presence of a capacitive coupling with two sensors and its amplification allows for detecting voltage changes, but there has to be a source of such voltage changes that would have a recognizable pattern. For this purpose the receiver 104 is equipped with a piece of hardware or software that will analyze quality and/or strength of the signal and use DiSEqC commands to signal back to the DiSEqC environment.

FIG. 3 shows a generic DiSEqC command sequence. DiSEqC commands sequences are transmitted in series as encrypted digital words. Standard sequence words are eight bits making one byte (increasing order), followed by one parity bit (odd). The DiSEqC data command sequence contains a frame byte 301, an address byte 302 and a command byte 303, which can be followed by a data byte 304.

After the bit flow sequence for the synchronization of reception, the frame byte contains the protocol data and direction identity. In the present invention, the preferred frame byte value is E0 305, which means "Command from master, no reply required first transmission" and is the most neutral command in DiSEqC. Nevertheless, selection of a command for the purpose of satellite antenna alignment is implementation dependent. In the reminder of the specification, E0 (hexadecimal) will be used a frame byte value utilized in connection with satellite antenna alignment process.

The DiSEqC components are addressed differently according to their function. Similar types of components are compiled in address groups. The first four bits of the address indicate the group, while the last four define variations within the group. Herein, 40 (hexadecimal) 306 will be used an address value utilized in connection with satellite antenna alignment process. This command indicates in the DiSEqC standard—installation Help.

The next word is a command. Herein, 44 (hexadecimal) 307 will be used an address value utilized in connection with satellite antenna alignment process. In principle any command may be used as preferably the component having the address 306 does not exist is the system.

The data byte 304 comprises information regarding signal quality/strength as determined by the receiver 104. In the present example FF means that signal quality is at the maximum. The value 304 may define 308 a duty cycle of a buzzer or diode outputting measurement indications to a person adjusting the antenna.

Selection of 305, 306, 307 values shall preferably be such that it would not interfere with other components of the DiSEqC system.

FIG. 4 shows a method for satellite antenna alignment using the device of FIG. 2. The process starts from receiving 401 from two capacitive coupling sensors 208, 209 a signal being a differential voltage in the coaxial cable between the locations of the sensors wherein the voltage is relative to a current level in a coaxial cable 102.

Next, at step 402, there voltage acquired in step 401 is amplified by the bandpass amplifier 210.

At step 403, the signal is subject to discrimination in order to obtain a square signal from a sinusoidal signal. Such discrimination process may be internal to the processor 213.

After that, at step 404 the signal is input to a processor, which is able to detect a valid DiSEqC command sequence, in particular as has been presented in FIG. 3. The detected command shall be indicative of signal quality.

At step 405 an indication of the signal strength and/or quality is output by the indication means.

It can be easily recognized, by one skilled in the art, that the aforementioned method for determining parameters of a satellite signal, or parts thereof, may be performed and/or controlled by one or more computer programs. Such computer programs are typically executed by utilizing the computing resources of the device. The computer programs can be stored in a non-volatile memory, for example a flash memory or in a volatile memory, for example RAM and are executed by the processing unit. These memories are exemplary recording media for storing computer programs comprising computer-executable instructions performing all the steps of the computer-implemented method according the technical concept presented herein.

While the invention presented herein has been depicted, described, and has been defined with reference to particular preferred embodiments, such references and examples of implementation in the foregoing specification do not imply any limitation on the invention. It will, however, be evident that various modifications and changes may be made thereto without departing from the broader scope of the technical concept. The presented preferred embodiments are exemplary only, and are not exhaustive of the scope of the technical concept presented herein.

Accordingly, the scope of protection is not limited to the preferred embodiments described in the specification, but is only limited by the claims that follow.

The invention claimed is:

1. A method for determining parameter of a satellite signal present in a coaxial cable 102, the method comprising the steps of:
    aligning two capacitive coupling sensors 208, 209 in proximity to a length of the coaxial cable 102, wherein the distance between the capacitive coupling sensors 208, 209 is below 10 centimeters;
    receiving 401 from two capacitive coupling sensors 208, 209 a signal being a differential voltage in the coaxial cable 102 between the locations of the capacitive coupling sensors 208, 209, wherein the voltage is relative to a voltage level in a coaxial cable 102;
    amplifying the differential voltage by a bandpass amplifier 210;
    detecting a valid DiSEqC command sequence being indicative of signal quality;
    outputting a signal being indicative of signal quality to an indication means 214.

2. The method according to claim 1, characterized in that aligning the two capacitive coupling sensors 208, 209 in proximity to a length of the coaxial cable 102 means aligning the two capacitive coupling sensors 208, 209 adjacent to the coaxial cable 102.

3. The method according to claim 1, characterized in that the two capacitive coupling sensors 208, 209 are insulated.

4. The method according to claim 1, characterized in that the valid DiSEqC command sequence being indicative of signal quality comprises a frame byte value of E0 (hexadecimal), address value of 40 (hexadecimal), command value of 44 (hexadecimal).

5. The method according to claim 4, characterized in that the valid DiSEqC command sequence being indicative of signal quality comprises a data byte 304 comprising information regarding signal quality/strength as determined by a receiver 104 connected to the coaxial cable 102.

6. An device for determining a parameter of a satellite signal present in a coaxial cable 102, the device comprising:
    two capacitive coupling sensors 208, 209 in proximity to a length of the coaxial cable 102, wherein the distance between the capacitive coupling sensors 208, 209 is below 10 centimeters;
    an electrical path connecting each of the two capacitive coupling sensors 208, 209 to a bandpass amplifier 210;
    an output path of the bandpass amplifier 210 connected to a processor 213 comprising means for detecting a valid DiSEqC command sequence being indicative of signal quality;
    an output path configured to output a signal being indicative of signal quality to an indication means 214.

7. The device according to claim 6, characterized in that a discrimination circuit is present between the bandpass amplifier 210 and the processor 213 configured to obtain a square signal from a sinusoidal signal.

* * * * *